United States Patent
Cosemans et al.

(10) Patent No.: US 9,224,448 B2
(45) Date of Patent: Dec. 29, 2015

(54) NANO-ELECTRO-MECHANICAL BASED MEMORY

(71) Applicants: IMEC vzw, Leuven (BE); Katholieke Universiteit Leuven, Leuven (BE)

(72) Inventors: Stefan Cosemans, Mol (BE); Ann Witvrouw, Herent (BE); Maliheh Ramezani, Leuven (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 14/558,523

(22) Filed: Dec. 2, 2014

(65) Prior Publication Data

US 2015/0179246 A1    Jun. 25, 2015

(30) Foreign Application Priority Data

Dec. 20, 2013 (EP) .................................. 13198870

(51) Int. Cl.
| | | |
|---|---|---|
| *G11C 11/00* | (2006.01) | |
| *G11C 11/40* | (2006.01) | |
| *G11C 11/50* | (2006.01) | |
| *G11C 11/52* | (2006.01) | |
| *G11C 23/00* | (2006.01) | |
| *G11C 5/06* | (2006.01) | |

(52) U.S. Cl.
CPC ........ *G11C 11/40* (2013.01); *G11C 5/06* (2013.01); *G11C 11/50* (2013.01); *G11C 11/52* (2013.01); *G11C 23/00* (2013.01)

(58) Field of Classification Search
USPC .......................................... 365/153, 187, 188
See application file for complete search history.

(56) References Cited

U.S. PATENT DOCUMENTS

| | | |
|---|---|---|
| 7,719,318 B1 | 5/2010 | Nordquist et al. |
| 8,125,824 B1 | 2/2012 | Ward et al. |
| 2005/0035787 A1 | 2/2005 | Bertin et al. |
| 2005/0036365 A1 | 2/2005 | Bertin et al. |
| 2005/0041465 A1 | 2/2005 | Rueckes et al. |

(Continued)

FOREIGN PATENT DOCUMENTS

| | | |
|---|---|---|
| WO | WO 2006/137876 | 12/2006 |
| WO | WO 2007/066133 | 6/2007 |

OTHER PUBLICATIONS

Extended European Search Report issued in Application No. 13198870.1, dated Jul. 8, 2014.
Chong, et al., Nanoelectromechanical (NEM) Relays Integrated with CMOS SRAM for Improved Stability and Low Leakage, IEEE/ACM International Conference on Computer-Aided Design Digest of Technical Papers, 2009, pp. 478-484.

(Continued)

*Primary Examiner* — Vu Le
(74) *Attorney, Agent, or Firm* — Knobbe Martens Olson & Bear LLP

(57) ABSTRACT

A non-volatile memory arrangement comprising a plurality of cells is disclosed. In one aspect, each cell comprises a memory element and a read selector in series. Further, the memory element is a nano-electro-mechanical switch comprising an anchor, a beam fixed to the anchor, a first and second control gate, for controlling the position of the beam, a first output node against which the beam can be positioned. The cell also comprises a read selector comprising a first selector terminal, a second selector terminal, the first selector terminal connected to the first output node. The first respectively second control gates of switches of a same word are connected together by a first respectively second write word line serving as control gate.

15 Claims, 10 Drawing Sheets

(56) References Cited

U.S. PATENT DOCUMENTS

| | | |
|---|---|---|
| 2005/0056866 A1 | 3/2005 | Bertin et al. |
| 2005/0063244 A1* | 3/2005 | Bertin et al. .................. 365/232 |
| 2006/0061389 A1* | 3/2006 | Bertin .......................... 326/104 |
| 2009/0021972 A1 | 1/2009 | Yoon et al. |
| 2009/0129139 A1 | 5/2009 | Kam et al. |
| 2009/0273962 A1 | 11/2009 | Van Kampen |
| 2012/0063195 A1 | 3/2012 | Lam et al. |
| 2012/0195102 A1 | 8/2012 | Chang et al. |
| 2013/0306937 A1 | 11/2013 | Cao et al. |

OTHER PUBLICATIONS

Jang et al., Nanotube based Vertical Nano-devices for High Integration Density, IEEE, 2006, pp. 89-92.

Kam, Design Analysis of the Vertically Stackable Nano-electromechanical Random Access Memory (NEMRAM),downloaded from http://citeseerx.ist.psu.edu/viewdoc/download?doi=10.1.1.136.1405&rep=rep1&type=pdf on or about Nov. 24, 2014, pp. 1-4.

* cited by examiner

NANO-ELECTRO-MECHANICAL BASED MEMORY

CROSS-REFERENCE TO RELATED APPLICATION

This application claims foreign priority to European Patent Application No. EP13198870.1, filed Dec. 20, 2013, the contents of which is incorporated by reference herein in its entirety.

BACKGROUND

1. Technological Field

The described technology relates to the field of memory arrangements. More specifically it relates to memory arrangements with memory elements having a nano-electro-mechanical switch as memory element.

2. Description of the Related Technology

Memory arrangements are widely researched and a large number of specific configurations are known. A category of interest for a large set of applications are non-volatile memory arrangements.

Recently, attention has been drawn to nano-electro-mechanical (NEM) switches, which are promising devices providing opportunities for use both in logic circuits and as memories, either standalone or combined with other technologies such as CMOS. One example of a non-volatile memory bit cell and an array thereof is described in U.S. Patent Publication No. 2009/0273962. The non-volatile memory bit cell described therein is a four terminal cell having a pull-up electrode, a pull-down electrode, a cantilever electrode and a contact electrode. Furthermore a NMOS transistor can be coupled to the contact electrode.

It is however not trivial to create a compact, reliable NEMS memory array that is sufficiently fast and that consumes a low energy per access, both for read and write.

There is a demand for high density, high access speed, and low energy consuming memory arrays, having these properties both for read and write operations.

SUMMARY OF CERTAIN INVENTIVE ASPECTS

It is an object of embodiments of the present invention to create a compact, reliable nano-electro-mechanical (NEM) memory arrangement.

It is an advantage of embodiments of the present invention that a high density of memory elements can be used in the arrangement. It is an advantage of embodiments of the present invention that a small foot print can be obtained for the memory elements.

It is an advantage of embodiments of the present invention that a fast memory arrangement is obtained.

It is an advantage of embodiments of the present invention that they can be used as SRAM replacement.

According to embodiments of the present invention it is possible to make a full memory or full memory array using only NEM switches.

It is an advantage of embodiments of the present invention that only one FET or no FET at all is required per cell. It is an advantage of embodiments of the present invention that the non-selected cells have a non-floating gate.

It is an advantage of embodiments of the present invention that the memory elements used may be non-volatile elements, although embodiments are not limited thereto.

The above objectives are accomplished by a method and device according to the present invention.

The present invention relates to a memory arrangement comprising a plurality of cells arranged in array structure wherein each cell comprises a memory element and a read selector in series, the memory element being a nano-electro-mechanical switch comprising an anchor, a beam fixed to the anchor, a first control gate, and a second control gate, for controlling the position of the beam, a first output node against which the beam can be positioned, a read selector, the read selector comprising a first selector terminal, a second selector terminal, the first selector terminal connected to the first output node, wherein, first control gates of nano-electro-mechanical switches belonging to a same word are connected together by a first write word line serving as control gate, second control gates of nano-electro-mechanical switches belonging to a same word are connected together by a second write word line serving as control gate.

The first write word line or second write word line can be a fixed potential line. It is an advantage of embodiments of the present invention that a high density of cells in the memory array can be obtained. The density is high because the first write word line serves as first control gate and the second write word line serves as second control gate. It is an advantage of embodiments of the current invention that sufficiently fast memory arrays are obtained.

The second write word lines of two neighboring words may be merged and at the same potential.

It is an advantage of embodiments of the current invention that one of the potential lines does not need to be controlled as it may have a fixed potential. It is an advantage of embodiments of the current invention that adjacent write word lines having the same fixed potential can be shared. It is an advantage of embodiments of the current invention that sharing the second write word line between adjacent nano-electro-mechanical switches increases the density of the non-volatile memory arrangement.

For one or more cells, the beam may be oriented substantially vertically with respect to a plane wherein the plurality of memory elements are extending in the arrangement. It is an advantage of embodiments of the present invention that the beam of the NEM switch is oriented vertically, i.e. out of the litho plane, since this reduces the area of the cell (smaller footprint). In embodiments of the present invention the longest part of the NEM switch is the beam. By orienting the beam in the vertical direction it does not influence the cell area. Therefore it is an advantage of embodiments of the present invention that a high density is realized.

The second output nodes of at least some neighboring nano-electro-mechanical switches may be shared between the nano-electro-mechanical switches. It is an advantage of embodiments of the present invention that the compactness is increased by sharing the output nodes of neighboring nano-electro-mechanical switches. In some embodiments of the present invention the second write word line serves as the second control gate.

The memory arrangement, e.g. non-volatile memory arrangement, may comprise a data line interconnecting the anchors of the nano-electro-mechanical switches belonging to the same bit position within a word, a read bit line interconnecting the second selector terminals of the read selectors belonging to the same bit position within a word, wherein the read bit line is parallel with the data line.

In embodiments of the current invention, the position of the beams of the NEM switches can be controlled through the write word lines (WWLs) and the data lines. The beam position of each NEM switch can be detected by measuring between a data line and a read bit line. Read selectors can be enabled or disabled through the read word lines. It is an advantage of embodiments of the present invention that easy routing of the first and/or second read bit line is possible. In case a complementary read scheme is used a complementary read selector may be added to each cell and complementary bit lines may be added to the matrix. The first terminal of the complementary selector may be connected to the second output node of the NEM switch. The second output node of the complementary read selector may be connected to the complementary bit line, which interconnects the second selector terminals of the complementary read selectors belonging to the same bit positions within a word. It is an advantage of embodiments of the present invention that sneak currents are avoided by use of the read selectors.

For a plurality of cells, the read selector may comprise a first selector control gate and wherein the arrangement comprises a read word line interconnecting the first selector control gates of the read selectors belonging to the same word, whereby the read selectors of a word can be enabled or disabled through the read word line belonging to that word.

It is an advantage of embodiments of the present invention that the read selectors can be enabled or disabled through the read word lines.

The memory arrangement may comprise
a read source line interconnecting the second selector terminals of the read selectors belonging to the same word, and
wherein the read source line may be parallel with the first write word line.

The read source line of a first word and the read source line of a second word may be shared.

It is an advantage of embodiments of the present invention that they are more compact when the read source lines are shared between two words than what would be the case if a read source line is present for each word.

The memory arrangement may comprise a read source line interconnecting the second selector terminals of the read selectors belonging to two neighboring words, wherein the read source line is parallel with the first write word line.

The read selector may comprise a first selector control gate and the memory arrangement further may comprise a read word line interconnecting the first selector control gates of the read selectors belonging to the same word,
and wherein the read selector of a word can be enabled or disabled through the read word line belonging to that word.

The data line typically may be interconnecting the anchors of the nano-electro-mechanical switches belonging to the same bit position within a word.

The memory arrangement furthermore may comprise an interconnect line, wherein the read source lines are at a fixed potential and wherein the read source lines of the different words are interconnected with each other through the interconnect line. It is an advantage of embodiments of the current invention that the read current of all accessed cells flows through multiple wires or even a plane instead of through a single read source line. In case the read current of all accessed cells flows through a single read source line this might cause problems with wire resistance and electro-migration limits. In embodiments of the current invention the read selector line is kept at a fixed potential and the signal is sensed on the data line. Therefore in embodiments of the current invention the read selector line can be replaced by a read selector plane interconnecting all bit line terminals and keeping them at the same voltage (e.g. zero volts). In embodiments of the present invention the read selector plane is realized by connecting together read selector lines once every so many cells. It is an advantage of embodiments of the current invention that a small area footprint can be realized even when using a read selector plane.

For one or more cells, the read selector may comprise a first selector control gate and wherein the read selector is a transistor wherein the gate of the transistor corresponds with the first selector control gate, wherein the drain of the transistor corresponds with the first selector terminal and wherein the source of the transistor corresponds with the second selector terminal or wherein, the source of the transistor corresponds with the first selector terminal and wherein the drain of the transistor corresponds with the second selector terminal.

It is an advantage of embodiments of the present invention that sneak current paths can be suppressed by use of a transistor. It is an advantage of embodiments of the present invention that a dense memory matrix is realized.

The read selector may comprise a first selector control gate and a second selector control gate wherein the read selector state can be controlled through the first selector control gate and the second selector control gate.

The read selector may be a nano-electro-mechanical switch wherein:
the first control gate of the nano-electro-mechanical switch corresponds with the first selector control gate,
the second control gate of the nano-electro-mechanical switch corresponds with the second selector control gate,
the anchor of the nano-electro-mechanical switch corresponds with the second selector terminal,
the first output node of the nano-electro-mechanical switch corresponds with the first selector terminal.

It is an advantage of embodiments of the present invention that leak currents can be limited by use of a nano-electro-mechanical switch. It is an advantage of embodiments of the current invention that the cell area is reduced comparing to, for example, SRAM. In embodiments of the current invention the cell area is reduced to between 36 $F^2$ and 54 $F^2$.

The read selector may be a two terminal selector. The two terminal selector may be a diode. It is an advantage of embodiments of the current invention that leakage paths through the cells of other words that are connected to the activated data line are avoided. It is an advantage of embodiments of the current invention that the area taken by the selector can be reduced by using a two-terminal instead of a three-terminal selector. The cell area can be reduced to below 12 $F^2$ and even below 9 $F^2$, compared to 160 $F^2$ for 6 T SRAM. It is an advantage of embodiments of the current invention that no mechanical switching delay in the critical read path is required.

The present invention also relates to the use of a memory arrangement as described above for storing data or for controlling operation of circuits.

Particular aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiments described hereinafter.

Figure 1A:
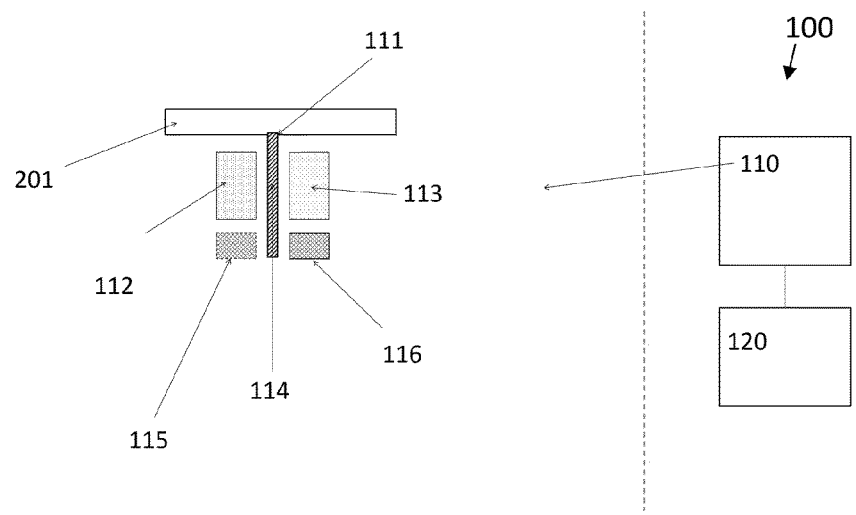
FIG. 1A provides a schematic illustration of a cell with a NEM switch and read selector as used in a non-volatile memory arrangement according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "a read selector," reference is made to a 2, 3, or 4 terminal device to limit the sneak current of half-selected cells on the read bit line or read source line. Read selectors may be implemented as transistors, diodes, nano-electro-mechanical (NEM) switches.

Where in embodiments of the current invention reference is made to "a cell" reference is made to the combination of a NEM switch (the memory element) and a read selector. In embodiments of the current invention the memory element is a NEM switch. The NEM switches comprise an anchor (111), a beam (114) fixed to the anchor (111), a first control gate (112), and a second control gate (113), for controlling the position of the beam (114), a first output node (115) (and possibly second output node (116)) against which the beam (114) can be positioned. The anchor, the beam, the first and second control gate as well as the output nodes are electrically conductive.

In a first aspect, the present invention relates to a memory arrangement. According to embodiments of the present invention, the memory arrays make use of bi-stable nano-electro-mechanical (NEM) devices. Embodiments of the present invention provide memory arrangements with a high density, a high read access speed, and a write energy and read energy comparable to SRAM. For example, assuming the beams can be scaled to the relevant dimensions, a memory element using a single FET selector can be about 4 times smaller than a conventional SRAM memory element. As the periphery of the NEM switch array can be small, this improvement in density also translates to the full memory design. The switching speed of embodiments of the present invention is varying between 100 ps and 100 ns, e.g. between 500 ps and 10 ns.

According to embodiments of the present invention, the memory arrangement comprises a plurality of cells arranged in an array structure wherein each cell comprises a memory element and a read selector in series. The memory elements thereby are nano-electro-mechanical switches comprising an anchor, a beam fixed to the anchor, a first control gate, and a second control gate, for controlling the position of the beam. The memory elements also comprise a first output node against which the beam can be positioned. Each cell also comprises a read selector, the read selector comprising a first selector terminal and a second selector terminal. The first selector terminal is connected to the first output node. According to embodiments of the present invention, the first control gates of nano-electro-mechanical switches belonging to a same word are connected together by a first write word line serving as control gate. Furthermore, the second control gates of nano-electro-mechanical switches belonging to a same word are connected together by a second write word line serving as control gate. Either the first write word line or second write word line can be biased at a fixed potential. According to at least some embodiments, the nano-electro-mechanical switches may be vertical beam nano-electro-mechanical switches, resulting in even more compact arrangements.

The memory elements may be non-volatile memory elements.

By way of illustration, embodiments of the present invention not being limited thereto, a number of standard and optional components will further be discussed in more detail with reference to the drawings.

Figure 1B:
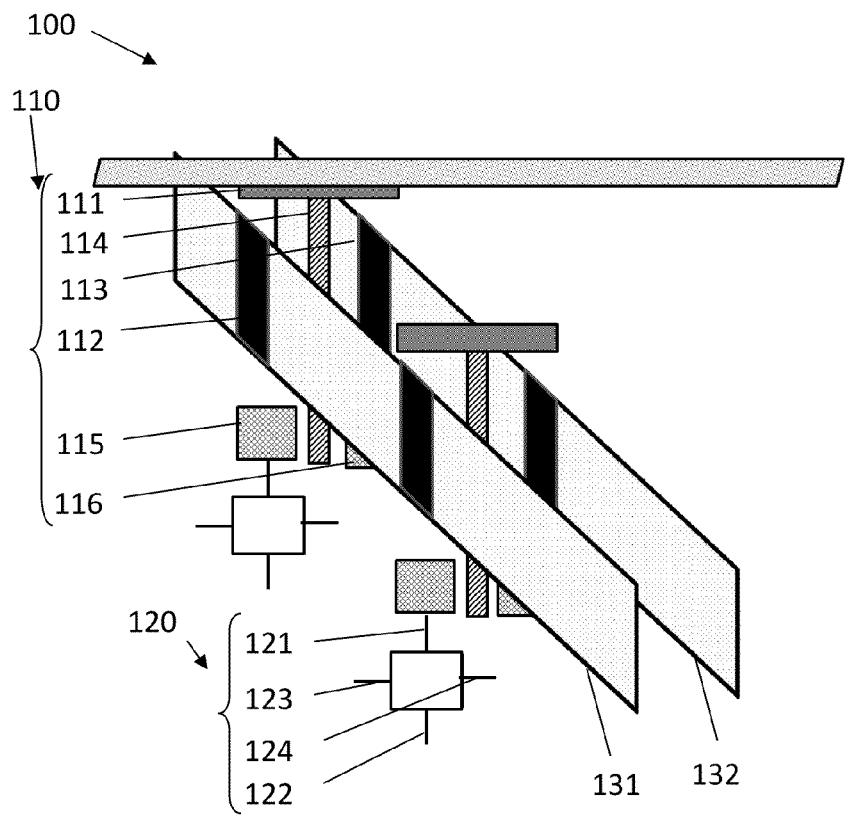
FIG. 1B provides a schematic 3D view of a non-volatile memory arrangement comprising a NEM switch and read selector per cell in accordance with embodiments of the present invention.
Figure 2:
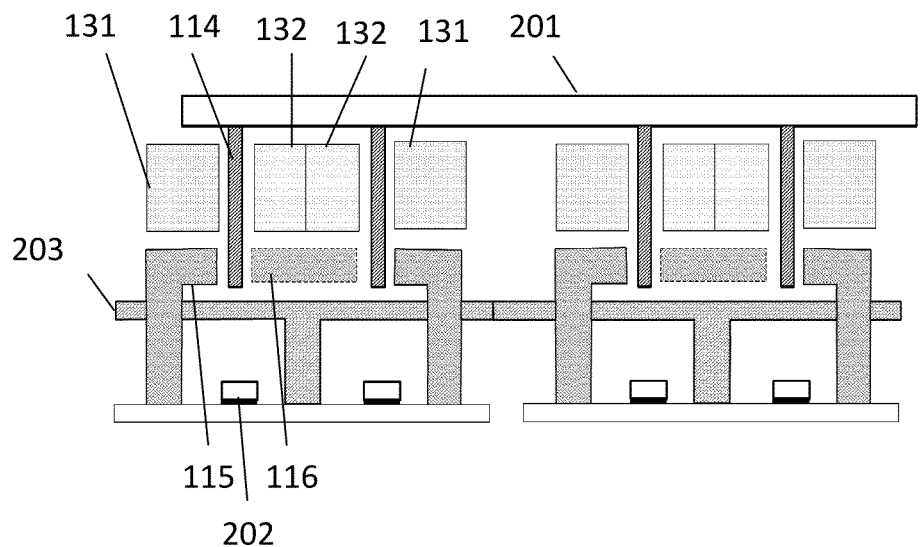
FIG. 2 provides a schematic front view of a non-volatile memory arrangement wherein the data line is parallel with the read bit line in accordance with embodiments of the current invention.

In embodiments of the current invention a bi-stable NEM switch 110 is used as the memory element. Such a NEM-switch 110 is schematically illustrated in FIG. 1A and FIG. 1B. FIG. 1A illustrates the basic components of a cell being a NEM switch and a selector, whereby the details of the NEM switch are also further detailed. The NEM switch 110 comprises an anchor 111, a first control gate 112, a second control gate 113, an electrically conductive beam 114, and a first output node 115. In embodiments of the current invention the anchor function is performed by the data line terminal 201, as illustrated in FIG. 2. The data line terminal is mechanically fixed. The function of the first control gate 112 is performed by the write word line, as the first control gates are linked thereby. The function of the second control gate 113 is performed by the second write word line, one of the word lines being on a fixed potential. The beam 114 of the NEM switch 110 advantageously may be oriented substantially vertically with relation to the substrate or the cell arrangements. The NEM switch 110 may comprise an optional second output node 116, which may be connected to a second read selector, or can be left floating or can be omitted.

Moreover embodiments of the current invention comprise a read selector 120. The read selector 120 itself comprises a first selector terminal 121, and a second selector terminal 122. The first selector terminal 121 is connected to the first output node 115 of the NEM switch 110. In embodiments of the present invention the second selector terminal 122 serves as bit line terminal connected to the read bit line 203 as illustrated in FIG. 2. The bit line terminal is mechanically fixed. In case the NEM switch has a second output node 116, the output node might be electrically floating or might be connected to a read selector 120.

The first control gates 112 of the NEM switches 110 belonging to the same word are connected together by a first write word line 131. The second control gates 113 of the NEM switches 110 belonging to the same word are connected together by a second write word line 132. The first write word lines 131 also serve as first control gate meaning that the function of the first control gate 112 is performed by the first write word line 131 itself. The second write word lines 132 also serve as second control gate meaning that the function of the second control gate 113 is performed by the second write word line 132 itself. It is an advantage of embodiments of the present invention that the first and second write word line can serve as control gate thereby reducing the footprint per cell. In embodiments of the present invention the second write word line 132 can be a fixed potential line.

The cell state transitions are initiated with electrostatic forces. In embodiments of the present invention a first control gate 112 and a second control gate 113 are used to control the position of an electrically conductive beam 114. The use of two control gates allow the use of electrostatic pull-out and pull in for both cell state transitions. In embodiments of the present invention the electrically conductive beam 114 is fixed to an anchor 111. In one of the states, the beam 114 connects to the first output node 115 of the NEM switch 110, which results in an electrical conduction path from the anchor 111 to the first output node 115. It is the existence of this conductive path that will be detected during the read operation.

In embodiments of the present invention a memory array configuration is realized. In these embodiments a read selector 120 is used per cell as otherwise the current through the non-selected cells will destroy the signal of the selected cell.

In an exemplary embodiment the read selector 120 is a 3-terminal selector. In case 3-terminal read selectors are used, the gate (i.e. the first selector control gate 123) of the read selector is connected to a read word line 202. In embodiments of the current invention the write word line 131, corresponding with a specific word, is shared with the read word line 202, corresponding with the same word.

In embodiments of the present invention the first output node 115 of the NEM switch 110 is connected to the drain (i.e. first selector terminal 121) of the read selector 120 and the source (i.e. the second selector terminal 122) of the read selector 120 is connected to the read bit line 203.

In embodiments of the present invention the first output node 115 of the NEM switch 110 is connected to the source (i.e. first selector terminal 121) of the read selector 120 and the drain (i.e. the second selector terminal 122) of the read selector 120 is connected to the read bit line 203.

In embodiments of the present invention the second output nodes 116 of neighboring NEM switches 110 are shared. This is illustrated in FIG. 2 showing the second write word lines 132 shared between NEM switches 110. The second write word lines function as the second control gates 113.

Figure 3:
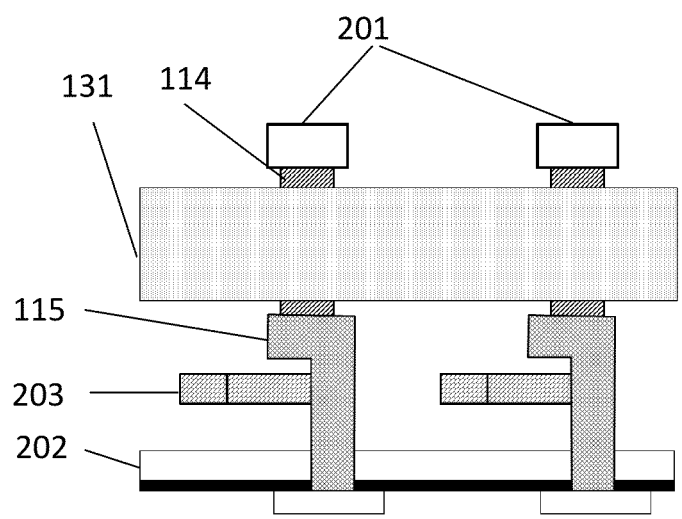
FIG. 3 provides a schematic side view of a non-volatile memory arrangement wherein the data line is parallel with the read bit line in accordance with embodiments of the current invention.
Figure 4:
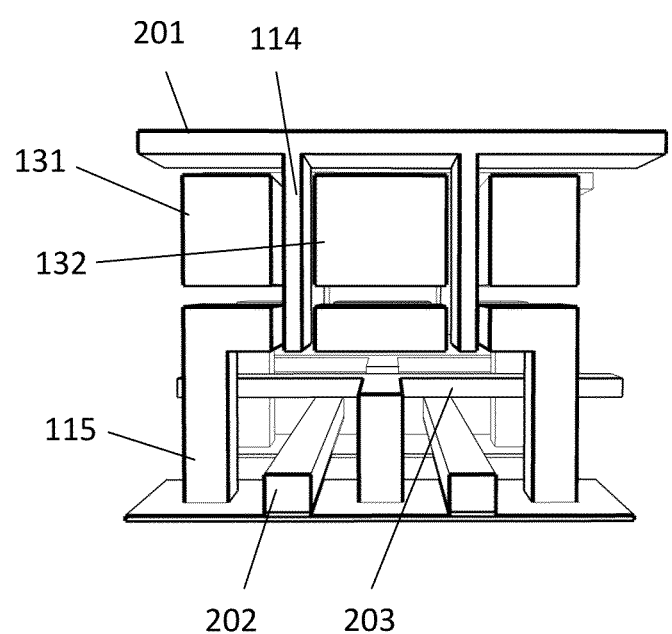
FIG. 4 provides a 3D-view of a non-volatile memory arrangement wherein the data line is parallel with the read bit line in accordance with embodiments of the current invention.
Figure 5:
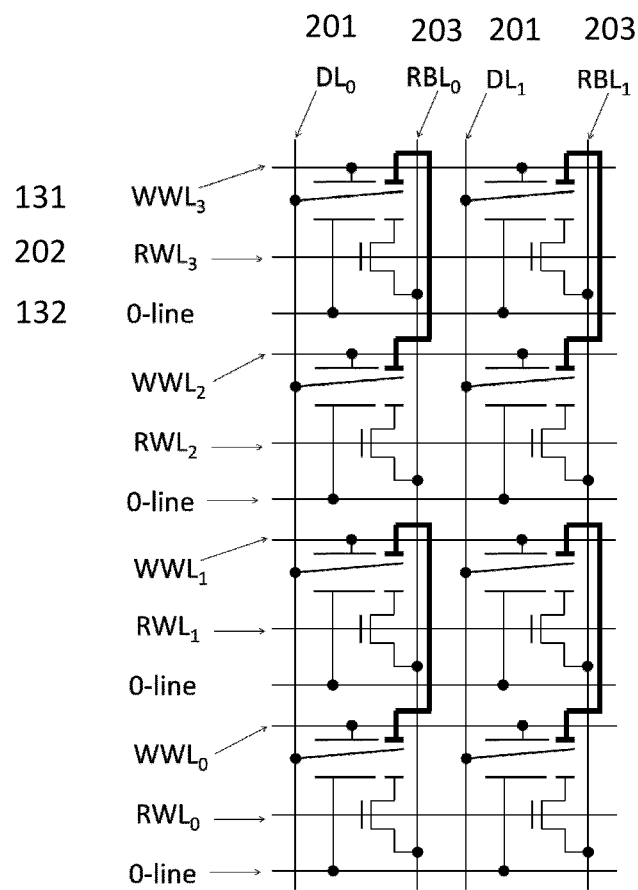
FIG. 5 illustrates in an electrical scheme the sharing of an output node between adjacent NEM switches in accordance with embodiments of the current invention.

In an exemplary embodiment, illustrated in FIG. 2, FIG. 3 and FIG. 4, the data line 201 connects together the anchors 111 of the NEM switches 110 belonging to the same bit position within a word. The read bit line 203 on its turn connects together the second selector terminals belonging to the same bit position within the different words. The read selectors 120 each comprise a first selector control gate 123. The read word line 202 connects together the first selector gates 123 of the read selectors 120 belonging to the same word. In the exemplary embodiment the read bit line 203 is parallel with the data line 201. The read selectors 120 of a word can be enabled or disabled through the read word line 202 belonging to that word. Optionally the second output nodes 116 of adjacent NEM switches 110 are shared as illustrated in FIG. 2. In embodiments where a MOSFET is used as read selector 120, the first output node 115 of the NEM switch 110 is connected with the source or drain of the MOSFET. FIG. 5 shows an electronic scheme of an embodiment of the current invention where the second output node 116 of adjacent NEM switches 110 is shared. In case both beams are connected to the first output node 115, no current path is present between the beams. In case only one of them is connected to the first output node 115, also no current path is present between the beams. Only if both are connected to the second shared output node 116 a conductive connection is present between the beams, but since these beams are connected to the same data line 201 this does not cause a problem. Therefore it is an advantage of embodiments of the current invention that the footprint of each cell can be decreased by sharing the second output nodes of adjacent cells without causing a short circuit problem.

Figure 6:
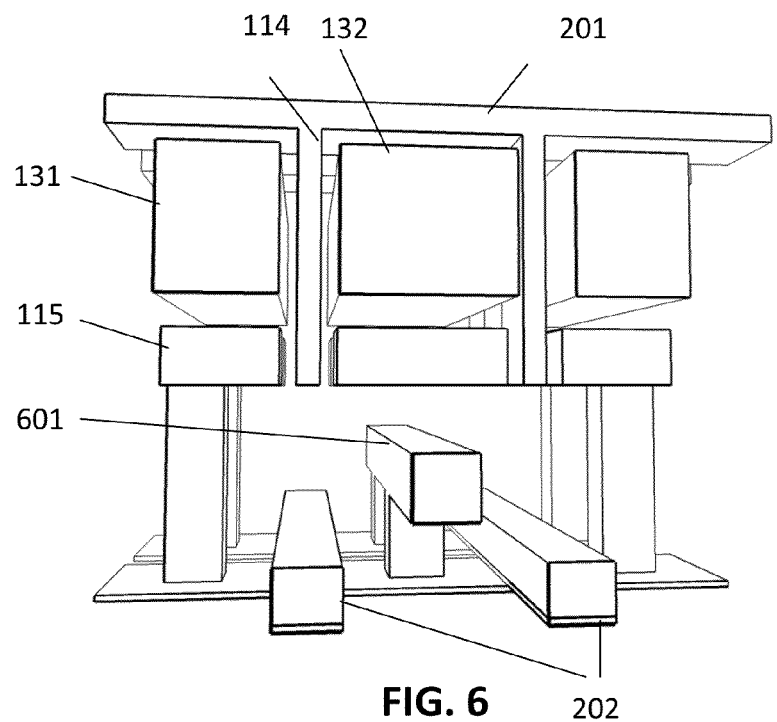
FIG. 6 provides a 3D-view of a non-volatile memory arrangement seen from the front comprising a read selector line parallel with a write word line in accordance with embodiments of the current invention.
Figure 7:
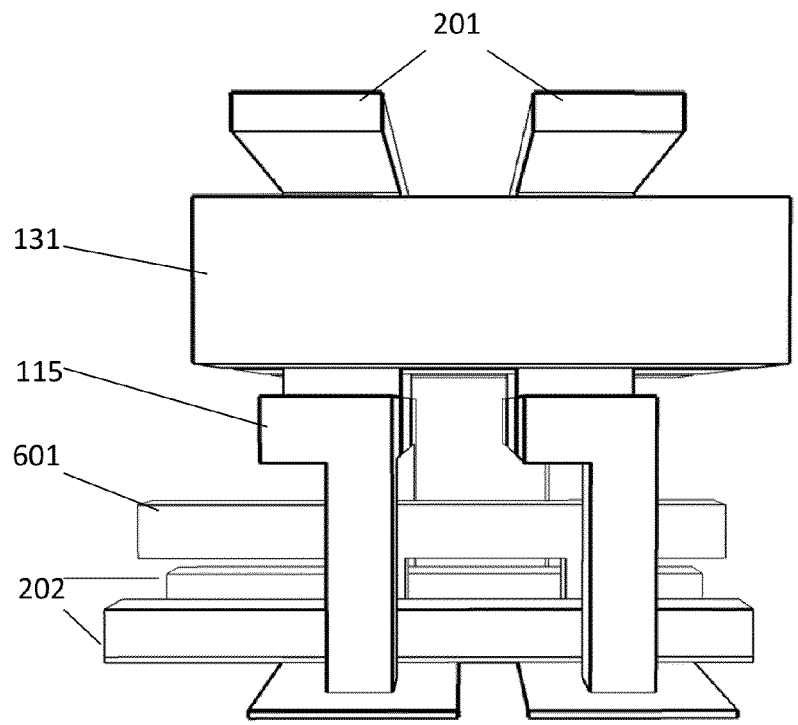
FIG. 7 provides a 3D-view of a non-volatile memory arrangement seen from the side comprising a read selector line parallel with the read and write word lines in accordance with embodiments of the current invention.

In another exemplary embodiment, illustrated in FIG. 6 and FIG. 7, a data line 201 interconnects the anchors 111 of the NEM switches 110 belonging to the same bit position within a word. A read source line 601 interconnects the second selector terminals 122 of the read selectors 120 belonging to the same word. Each read selector 120 comprises a first selector gate. A read word line 202 interconnects the first selector control gates 123 of the read selectors 120 belonging to the same word. In this exemplary embodiment the read source line 601 is parallel with the first write word line 131. The read selectors 120 of a word can be enabled or disabled through the read word line 202 belonging to that word.

Figure 8:
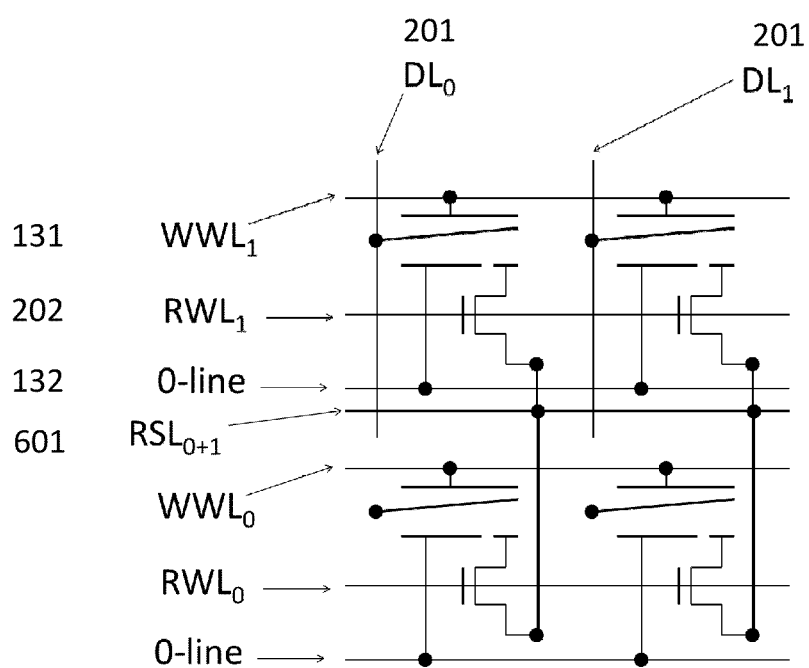
FIG. 8 illustrates in an electrical scheme a non-volatile memory arrangement comprising a read selector line in accordance with embodiments of the current invention.

In an exemplary embodiment of the current invention, of which the electrical scheme is illustrated in FIG. 8, the read source line 601 of a first word and the read source line of a second word are shared.

Figure 9:
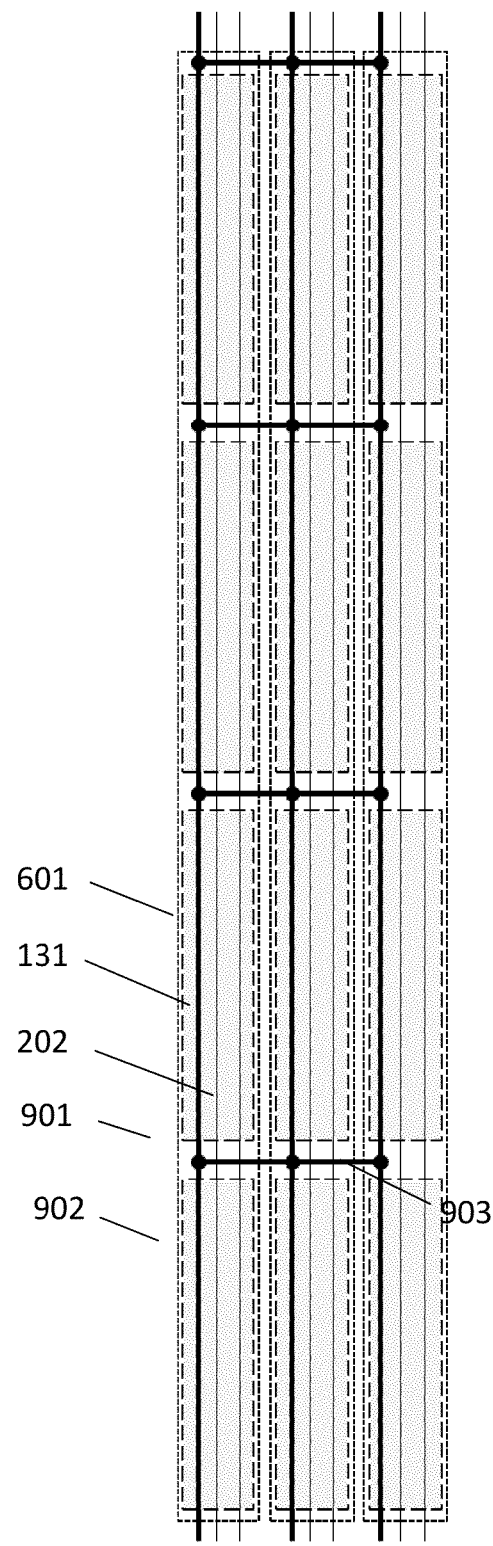
FIG. 9 provides a schematic top view of a read source plane in accordance with embodiments of the current invention.

In yet another exemplary embodiment the read source lines 601, each belonging to a different word, are interconnected with interconnect lines 903, as illustrated in FIG. 9. The read source lines 601 are hence replaced with a plane (the read source plane). In this embodiment the signal is sensed on the data lines 201. Connecting the read source lines 601 together is possible in this embodiment because the read source line 601 can always stay at a fixed potential (e.g. 0 V) for all cells, whether they are accessed or not. The read source plane connects to all, or an arbitrary subset of cells of an array. In embodiments with separate read source lines the read current of all accessed cells flows through a single read source line wire. This can result in problems with wire resistance and electro-migration limits. It is an advantage of embodiments of the current invention that these problems are resolved by read source planes. A read source plane might be realized by interconnecting read source lines together once every so many cells, keeping local read source lines as this allows a small area footprint. In the exemplary embodiment of the present invention illustrated in FIG. 9 read source lines 601 are interconnected every so many cells. Thereby uninterrupted segments of cells 902 are created within a word (i.e. a row of cells). The write word lines 131 and read word lines 202 are also illustrated in FIG. 9.

In other embodiments of the present invention, the read selector 120 is a transistor wherein the gate corresponds with the first selector control gate 123, the source corresponds with the first or second selector terminal, and the drain corresponds with the remaining selector terminal. An exemplary embodiment of a memory arrangement 100 comprising a transistor as read selector is for example illustrated in FIG. 2 to FIG. 8.

In an exemplary embodiment of the current invention the read selector 120 is a four terminal selector. It comprises, besides a first and second selector terminal 121, 122, a first and second control gate 123,124. The read selector state can be controlled through the first selector control gate 123 and the second selector gate 124.

Figure 10:
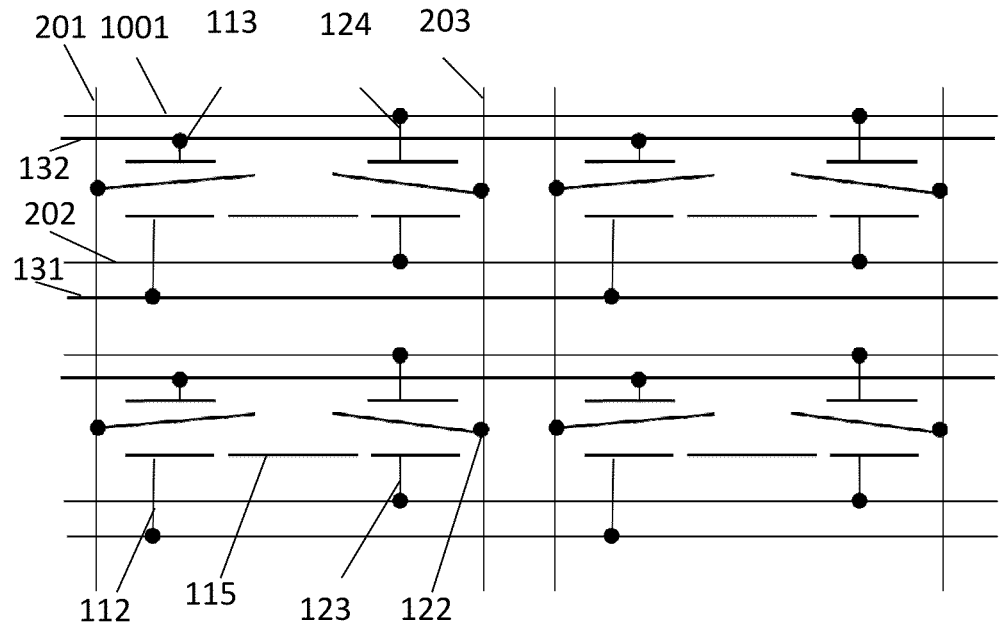
FIG. 10 illustrates in an electrical scheme a NEM+NEM switch configuration comprising a read bit line in accordance with embodiments of the current invention.

In an exemplary embodiment of the present invention the read selector is a NEM switch, e.g. a non-volatile NEM switch. The read selector may be identical to the non-volatile NEM switch used as storage element. An example of such an embodiment is illustrated in FIG. 10. In the present example it is assumed that the same kind of NEM switch is used for storage and for selection. The first control gate of the selector NEM switch is the first selector control gate 123. The second control gate of the selector NEM switch is the second selector control gate 124. In embodiments of the present invention the second control gates 124 of cells belonging to the same word are electrically connected with a disconnect line 1001 as illustrated in FIG. 10. The anchor of the selector NEM switch is the second selector terminal 122. The first output node of the selector NEM switch is the first selector terminal 121. The second write word line 132 in FIG. 10 interconnects the second control gates 113 of the NEM switches 110 belonging to the same word. The read word line 202 in FIG. 10 interconnects the first selector control gates 123 of cells belonging to the same word. The first write word line 131 in FIG. 10 interconnects the first control gates 112 of the NEM switches 110 belonging to the same word. In the embodiment of FIG. 10 the first write word line 131 is a fixed potential line at 0 V. The DC biases may more generally be between −Vdd and 2 times Vdd, depending on the situation, whereby Vdd is the maximal voltage which the transistors in the used technology can sustain. The data line 201 in the embodiment of FIG. 10 interconnects the anchors 111 of the NEM switches 110 belonging to the same bit position within a word. The read bit line 203 in the embodiment of FIG. 10 interconnects the second selector terminals 122 of the read selectors 120 belonging to the same bit position within a word.

In embodiments of the current invention the beam of the read selector can be volatile or non-volatile, also referred to as sticky or non-sticky in the present context. In case the beam is non-sticky it returns to the disconnected position when it is not actuated, for example in case the read word line 202 and the disconnect control gate are biased at the same potential, e.g. 0V. This avoids the need for disconnect lines.

Figure 11:
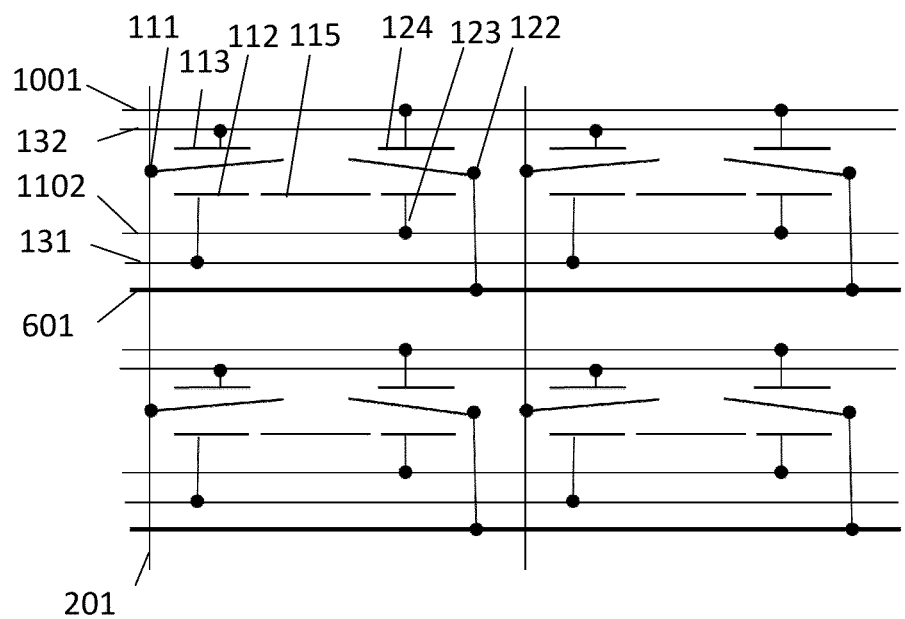
FIG. 11 illustrates in an electrical scheme a NEM+NEM switch configuration comprising a read source line in accordance with embodiments of the current invention.

In an exemplary embodiment of the current invention, illustrated in FIG. 11, the read selector 120 is a NEM switch 110, wherein:
- the first selector terminal 121 of the read selector is the first output node of the selector NEM switch,
- the second selector terminal 122 of the read selector is the anchor of the selector NEM switch,
- the first selector control gate 123 of the read selector is the first control gate of the selector NEM switch,
- the second selector control gate 124 of the read selector is the second control gate of the selector NEM switch.

In embodiments of the current invention where reference is made to "a selector NEM switch," reference is thus made to a read selector that is a NEM switch.

In embodiments where reference is made to "a selector beam," reference is made to the beam of a NEM switch, the NEM switch itself being a read selector.

In the embodiment illustrated in FIG. 11, the second selector terminals 122 of read selectors 120 belonging to the same word are connected by the read source line 601. In embodiments of the current invention a read source plane can be created by using segments with read source lines, and stitching them together every so many cells as is illustrated in FIG. 9. The first control gates 112 of the NEM switches 110 belonging to the same word are connected together by the first write word line 131. In the embodiment of FIG. 11 the first write word line 131 is biased at a fixed potential, e.g. 0V, or more generally between −Vdd and 2 times Vdd, depending on the situation, whereby Vdd is the maximal voltage which the transistors in the used technology can sustain. The read word line 202 interconnects the first selector control gates 123 of the read selectors 120 belonging to the same word. The second write word line 132 interconnects the second control gates 113 of the NEM switches 110 belonging to the same word. The disconnect line 1001 interconnects the second selector control gates of the read selectors 120 belonging to the same word. The data line 201 interconnects the anchors 111 of the NEM switches 110 belonging to the same bit position within a word.

Whereas the above examples are mainly directed to non-volatile NEM switches, embodiments of the present invention also may be implemented with volatile NEM switches, which can be used to create all kinds of digital logic circuits. A memory array based thereon could be made without the need for CMOS transistors. Such a memory could in one example be monolithically integrated on top of a CMOS chip, thus leaving CMOS area free for other elements. Therefore, two different kinds of beams could be used for the different purposes applied in the non-memory-cell part of the chip relevant with the 2 stacked NEMS layers.

Figure 12:
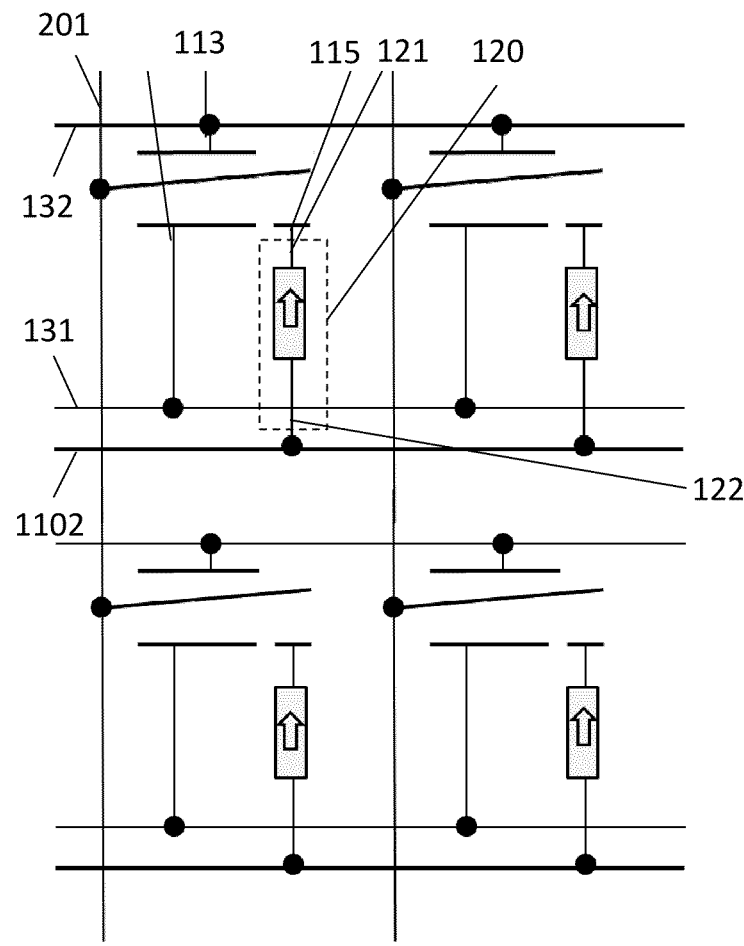
FIG. 12 illustrates in an electrical scheme a NEM switch+ 2-terminal selector in accordance with embodiments of the current invention.

In yet another exemplary embodiment the read selector is a 2-terminal device. For example a diode, an ovonic threshold switch, or a non-linear tunnel junction can be used. With the 2-terminal read selectors 120, the read selector is placed between the first output node 115 of the NEM switch 110 and a read select line 1102. This read select line 1102 will sink the read current of all activated cells connected to it. An exemplary implementation of such an embodiment with a diode as read selector 120 is schematically illustrated in FIG. 11. The data line 201 interconnects the anchors 111 of the NEM switches 110 belonging to the same bit position. The second write word line 132 interconnects the second control gates 113 of the NEM switches 110 belonging to the same word. The first write word line 131 interconnects the first control gates 112 of the NEM switches 110 belonging to the same word. In the embodiment illustrated in FIG. 12 the first write word line is a fixed potential line at 0V. The 2-terminal device, e.g. the diode, is in between read select line 1102 and the first output node 115 of the memory element. A read select line 1102 interconnects the 2-terminal devices belonging to the same word.

In embodiments according to the present invention the 2-terminal selector can be integrated on a different location between the beam 114—the first or second output node 115, 116—and the read select line 1102, for example on the beam 114 of the NEM switch 110 itself. Advantageously it should be positioned at the end of the beam, between the end of the gate overlap region and the end of the beam. The selector function could also be implemented where beam and output node make contact by proper choice of beam and output node surface material. In one example, the beam may be made of n-type semiconductor, the output node surface may be p-type semiconductor.

Embodiments of the current invention are compact, reliable nano-electro-mechanical (NEM) switches that can be used for memory replacement.

As indicated above, embodiments of the present invention advantageously allow to have memory arrangements with cells having a small footprint. By way of illustration, the area consumption in case of a cell comprising a NEM switch and using an NMOS configuration with a 1.5 gate pitch and two metal pitches, corresponds with [6 F×6 F] whereby F is the feature size of the used technology (e.g. 10 nm). The corresponding area for 6 T SRAM is 160 $F^2$.

By way of illustration, operating methods of the memory arrangement 100 as described above will now be discussed, indicating how the arrangements can be used. Two particular operating methods are described, whereby in a first operating method the anchor is connected through the beam with the first output node 115 of the NEM switch 110 and in a second operating method the anchor is connected through the beam with the second output node 116.

When the first and second control gate (112, 113) are actuated to a sufficiently large differential potential, the beam is attracted towards one of the control gates, based on the potential put on the anchor 111. In embodiments of the present invention, the anchor 111 is connected to the data line 201. In embodiments of the present invention "sufficiently large" means that the electrostatic force in combination with the elastic force is larger than the adhesion forces. In case of non-volatile switches the adhesion forces of the NEM switch 110 are larger than the elastic restoring force. The potential required to achieve sufficiently large electrostatic force to change the beam position may depend on the scale and geometry of the NEM switches. In embodiments targeted as dense memory for advanced CMOS technologies, sufficiently large means for example a voltage difference between 0.5V and 1.8V, for example between 0.7V and 1.2V. In embodiments of the current invention one of the control gates 112, 113 is connected to or serves as the write word line (WWL), while the other control gate can be kept at a fixed voltage e.g. 0V, or more generally between −Vdd and 2 times Vdd, depending on the situation, whereby Vdd is the maximal voltage which the transistors in the used technology can sustain. In the following, the high voltage will be denoted as 1, the zero voltage will be denoted as 0.

When the first control gate 112 is set to 1, the anchor 111 and hence the beam 114 is set to 0, and the second control gate 113 is at 0, the beam is attracted to the first control gate.

When the first control gate 112 is set to 1, the anchor 111 and hence the beam is set to 1, and the second control gate 113 is at 0, the beam is attracted to the second control gate.

When the two control gates 112, 113 are at the same potential, the beam stays fixed in its current stable position (either stuck towards the first control gate 112 or stuck towards the second control gate 113) whatever the voltage on the anchor 111, the first output node or the second output node. When the first control gate 112 is set to 0, and the second control gate 113 is at 0, the beam stays fixed in its current stable position.

The control gates can be used to sensitize or de-sensitize the beam, and the data line 201 (connected to the anchor) can be used to select whether to write a 1 or a 0 when the beam is sensitized.

In an exemplary embodiment a 3-terminal device is used as read selector 120 (e.g. a MOSFET device). When the cell is accessed for reading, a small voltage difference is applied between the anchor 111 (e.g. the data line 201 connected to the anchor) and the second selector terminal 122 (e.g. the read bit line 203) and the read word line 202 is asserted. If the NEM switch 110 is in the state in which the beam 114 makes connection with the first output node 115, a conductive path between the anchor 111 and the second selector terminal 122 (e.g. between the data line 201 and the read bit line 203) exists and a current flows. This current is sensed by the sensing device, e.g. a typical voltage or current sense amplifier as used in other memories. The voltage difference between the anchor 111 and the second selector terminal 122 can be created by a pre-charge operation after which the second selector terminal 122 (e.g. the read bit line 203) is left floating, as in voltage-based read schemes for SRAM and eDRAM.

If a non-volatile NEM selector is used as a read selector 120, a slightly different actuation scheme is required. In the embodiment illustrated in FIG. 10 the read bit line 203 is zero at all times. In standby mode all selector beams are in disconnected position. In standby mode also the read word lines 123 as well as the disconnect lines of all words are set at 0 and the second write word line 132 is set to 0. Whereas the second write word line 132 has been used in the particular example, also the first write word line could be used.

For writing, the second write word line 132 of a certain word is set to 1. The data line 201 is set to the voltage corresponding to the data to be written to the cell. Next, the second write word lines 132 and the data lines 201 are set back to 0.

For reading, the read word line 123 corresponding with a certain word is set to 1. Since the read bit line is always at 0 this causes the selector beams on the specific read word line 123 to connect. In a next step a voltage is applied on the data line 201. By measuring the current through the data line 201 and/or through the read bit line 203 the cell state can be determined. In a next step the read word line 123 of the specific word is set to 0 and the disconnect line is set to 1. Since the read bit line 203 is always at 0 this causes the selector beams to disconnect. In a next step the disconnect line is again set to 0.

If, in an embodiment according to FIG. 10, the selector beam is non-sticky the selector beam will return to the disconnected position when not actuated. For example when the read word line 123 is 0 and the disconnect line 1001 is 0. Therefore disconnect lines are not required when non-sticky selector beams are used.

In the embodiment as shown in FIG. 11 a slightly different scheme is applied compared to the embodiment of FIG. 10. Whereas in FIG. 10 a read bit line 203 interconnects the second selector terminals 122 of the read selectors 120 belonging to the same bit position, in FIG. 11 it is a read source line 601 that interconnects the second selector terminals 122 of the read selectors 120 belonging to the same word. For operating, the read source line or read source plane is kept at 0. All other method steps are the same as in the embodiment illustrated in FIG. 10.

If a 2-terminal read selector is used, the read select line 1102 sinks the read current of all activated cells connected to it. When a sufficient voltage difference is applied, e.g. a voltage above the selector threshold voltage is applied, between the anchor 111 and the second selector terminal 122 (e.g. connected to the read select line), the read selector 120 will become sufficiently conductive to allow current to pass through the selected cell if the beam 114 is in the conductive state (i.e. connected to the first output node). For the non-selected cells on the data lines 201 and the read word line 202, the selector device receives a lower voltage, or a voltage in reverse polarity, and it blocks the current. For the embodiment of FIG. 12 the following exemplary bias scheme can be applied:

In standby mode, the second write word line 132, the read select line 1102, and the data line 201 are all set at 0.

In write mode, first the data line of the specific bit position is set to the value corresponding to the value to program and the second write word line 132 of the corresponding word (of which a specific cell needs to be programmed) is actuated, next the specific second write word line is deactivated.

In read mode, $\Delta V$ is applied, i.e. sufficient voltage difference, on the selected read select line 1102 and the non-selected read select lines 1102 are set to 0. If the storage beam is connected and $\Delta V$ is applied, current flows through the selected cell between the data line 201 and the selected read word line 202. If the storage beam was disconnected, no current flows through the selected cell.

Figure 13:
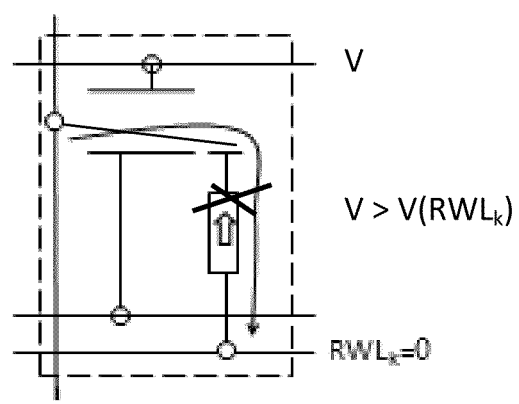
FIG. 13 illustrates in an electrical scheme a 2-terminal read selector blocking the current in accordance with embodiments of the current invention.
Figure 14:
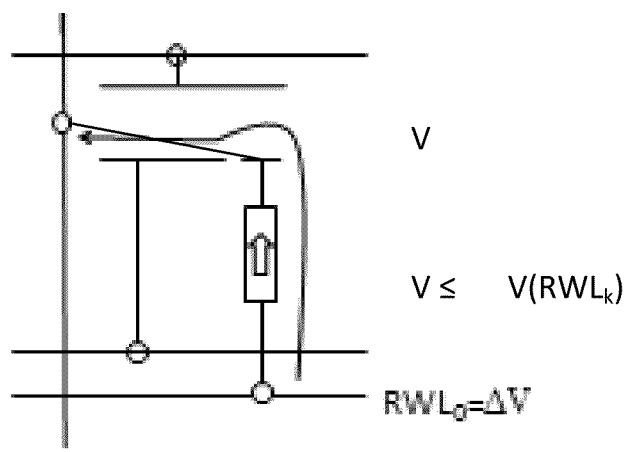
FIG. 14 illustrates in an electrical scheme a 2-terminal read selector biased such that the current passes through in accordance with embodiments of the current invention.

For example, if a diode is used as read selector 120, $\Delta V$ should be such that the voltage over the diode is in forward direction and sufficiently large (as illustrated in FIG. 14). The read selector 120 is needed to avoid leakage paths through the cells of other words that are connected to the activated data line 201. The voltage on the read select line 1102 of these half selected cells is different from that on the selected read select line e.g. 0V rather than $\Delta V$ (illustrated in FIG. 13). Due to the current through the selected cell, the actual signal voltage on the data line 201 will change, resulting in a bias over these dataline-half-selected cells. The read selectors of the dataline half selected cells ensure that no sneak current flows through these cells. In the memory array, a back end of line diode selector is shown, positioned between the output node of the switch and the read select line. Alternatively it could also be integrated in the switch output node contact or in the beam itself. The read select line in this embodiment is parallel to the write word line.

In another aspect, embodiments of the current invention relate to the use of the memory arrangement 100 for storing configuration data or for controlling the operation of several circuits. The memory arrangement may be used in a variety of applications, such as for example for selecting the function of an FPGA logic block, configuring routing connections in FPGA or a network on chip, calibrating an analog component, storing redundancy settings in memories, e.g. disable defect words or columns in SRAM or DRAM arrays, etc.

What is claimed is:

1. A memory arrangement comprising a plurality of cells arranged in an array structure, wherein each cell comprises:
    a memory element and a read selector in series, the memory element being a nano-electro-mechanical switch comprising an anchor, a beam fixed to the anchor, a first control gate, and a second control gate, for controlling the position of the beam, a first output node against which the beam can be positioned, the read selector comprising a first selector terminal, a second selector terminal, the first selector terminal connected to the first output node,
    wherein first control gates of nano-electro-mechanical switches belonging to a same word are connected together by a first write word line serving as control gate, and second control gates of nano-electro-mechanical switches belonging to a same word are connected together by a second write word line serving as control gate.

2. The memory arrangement according to claim 1, wherein for one or more cells, the beam is oriented substantially vertically with respect to a plane, and wherein the plurality of memory elements are extending in the arrangement.

3. The memory arrangement according to claim 1, wherein the second output nodes of at least some neighboring nano-electro-mechanical switches are shared between the nano-electro-mechanical switches.

4. The memory arrangement according to claim 1, wherein either the first write word line or second write word line is a fixed potential line.

5. The memory arrangement according to claim 1, wherein the second write word lines of two neighboring words are merged and at the same potential.

6. The memory arrangement according to claim 1, wherein for a plurality of cells, the read selector comprises a first selector control gate and wherein the arrangement comprises a read word line interconnecting the first selector control gates of the read selectors belonging to the same word, whereby the read selectors of a word can be enabled or disabled through the read word line belonging to that word.

7. The memory arrangement according to claim 6, the memory arrangement comprising:
    a data line interconnecting the anchors of the nano-electro-mechanical switches belonging to the same bit position within a word; and
    a read bit line interconnecting the second selector terminals of the read selectors belonging to the same bit position within a word, wherein the read bit line is parallel with the data line.

8. The memory arrangement according to claim 1, the memory arrangement comprising:
    a read source line interconnecting the second selector terminals of the read selectors belonging to the same word, wherein the read source line is parallel with the first write word line.

9. The memory arrangement according to claim 1, the memory arrangement comprising:
    a read source line interconnecting the second selector terminals of the read selectors belonging to two neighboring words, wherein the read source line is parallel with the first write word line.

10. The memory arrangement according to claim 8, the memory arrangement further comprising an interconnect line, wherein the read source lines are at a fixed potential, and wherein the read source lines of the different words are interconnected with each other through the interconnect line.

11. The memory arrangement according to claim 1, wherein for one or more cells, the read selector comprises a first selector control gate, wherein the read selector is a transistor, wherein the gate of the transistor corresponds with the first selector control gate, and
    wherein
        the drain of the transistor corresponds with the first selector terminal, and the source of the transistor corresponds with the second selector terminal; or
        the source of the transistor corresponds with the first selector terminal, and the drain of the transistor corresponds with the second selector terminal.

12. The memory arrangement according to claim 1, wherein the read selector is a nano-electro-mechanical switch, and wherein:
    the first control gate of the nano-electro-mechanical switch corresponds with the first selector control gate;
    the second control gate of the nano-electro-mechanical switch corresponds with the second selector control gate;
    the anchor of the nano-electro-mechanical switch corresponds with the second selector terminal; and
    the first output node of the nano-electro-mechanical switch corresponds with the first selector terminal.

13. The memory arrangement according to claim 1, wherein the read selector is a two terminal selector.

14. The memory arrangement according to claim 13, wherein the two terminal selector is a diode.

15. A method of using a memory arrangement according to claim 1 for storing data or for controlling operation of circuits.

* * * * *